US008526264B2

(12) United States Patent
Parashar et al.

(10) Patent No.: US 8,526,264 B2
(45) Date of Patent: Sep. 3, 2013

(54) PARTIAL WRITE ON A LOW POWER MEMORY ARCHITECTURE

(75) Inventors: Anuj Parashar, Aligarh (IN); Marc Vernet, Montbonnot Saint Martin (FR)

(73) Assignee: STMicroelectronics International N.V., Amsterdam (NL)

( * ) Notice: Subject to any disclaimer, the term of this patent is extended or adjusted under 35 U.S.C. 154(b) by 181 days.

(21) Appl. No.: 13/172,592

(22) Filed: Jun. 29, 2011

(65) Prior Publication Data

US 2013/0003484 A1  Jan. 3, 2013

(51) Int. Cl.
G11C 8/00 (2006.01)

(52) U.S. Cl.
USPC ............ 365/230.03; 365/230.01; 365/230.06; 365/231

(58) Field of Classification Search
USPC ............... 365/230.03, 230.01, 230.06, 231
See application file for complete search history.

(56) References Cited

U.S. PATENT DOCUMENTS

| | | | | | |
|---|---|---|---|---|---|
| 4,658,377 | A | * | 4/1987 | McElroy | 365/149 |
| 5,303,191 | A | * | 4/1994 | Eagan et al. | 365/194 |
| 5,347,484 | A | * | 9/1994 | Kwong et al. | 365/49.16 |
| 5,579,280 | A | * | 11/1996 | Son et al. | 365/238.5 |
| 5,701,271 | A | * | 12/1997 | Lee | 365/230.02 |
| 5,883,826 | A | * | 3/1999 | Wendell et al. | 365/63 |
| 6,256,253 | B1 | * | 7/2001 | Oberlaender et al. | 365/230.02 |
| 6,278,650 | B1 | * | 8/2001 | Kang | 365/230.03 |
| 6,314,029 | B1 | * | 11/2001 | Ko et al. | 365/190 |
| 6,396,728 | B1 | * | 5/2002 | Abedifard et al. | 365/63 |
| 6,614,685 | B2 | * | 9/2003 | Wong | 365/185.11 |
| 7,230,862 | B2 | * | 6/2007 | Kim et al. | 365/194 |
| 7,808,847 | B2 | * | 10/2010 | Wang et al. | 365/200 |
| 7,843,746 | B2 | * | 11/2010 | Ryu | 365/200 |
| 8,130,528 | B2 | * | 3/2012 | Yan et al. | 365/51 |
| 8,374,051 | B2 | * | 2/2013 | Yan et al. | 365/230.06 |

* cited by examiner

Primary Examiner — Viet Q Nguyen
(74) Attorney, Agent, or Firm — Hogan Lovells US LLP

(57) ABSTRACT

A memory includes memory cells, data lines, block select lines, and selection circuitry. The data lines provide data to and from the memory cells and may be grouped into blocks. Each block includes data lines. Each of the block select lines is associated with a respective one of the blocks. The selection circuitry is select a block in response to a respective block select line and the memory performs a memory operation using the selected bit line block.

21 Claims, 4 Drawing Sheets

PARTIAL WRITE ON A LOW POWER MEMORY ARCHITECTURE

FIELD OF THE INVENTION

Embodiments relate to memory architecture. In particular, but not exclusively, embodiments relate to low power memory architecture and low power large word memory architecture allowing partial writes.

BACKGROUND OF THE INVENTION

Memories, such as random access memory (RAM), for example, or static or dynamic RAM, may take up considerable space in a system and may dominate power consumption of the system.

In order to maximize power efficiency, a large word memory architecture may be implemented. A large word memory architecture may be one in which multiple bits corresponding to a larger sized word are written to the memory simultaneously. For example, in some systems, the large word may be 32, 64, 128 or 256 bits.

Although the use of large words may increase bandwidth and reduce power consumption, allowance may be made for partial writes to fewer bits corresponding to a word size smaller than the large word.

Standard macrocell memory may implement large word sizes. In standard macrocell memory, write operations are performed through pass gates in a sense amplifier using differential data lines. The sense amplifiers may be switched by an enable signal to connect bit lines to charged differential data lines indicating the value to be written. For example, when the differential data or write lines have been charged, an enable signal switches a pass gate transistor for each sense amplifier to connect the differential data or write line to a differential bit line for that sense amplifier column. These memories may have a low swing data transfer. They may also provide very large words—typically 256 bit words.

In order to perform partial write operations for standard macrocell memory, a large word may be fetched from the memory and stored in a cache memory, a read/write operation may be carried out on parts of the large word stored in the cache memory, and the large word may be written back into the memory. In this manner, several operations, including fetch/modify/writeback operations, are carried out for a partial write.

The standard macrocell may therefore be more suited to systems where there is a low frequency in pure random operations such as partial writes.

Pure random macrocells may perform a write operation on a gate of a transistor placed in the sense amplifier. The transistor may behave as a switch, switching on and off according to a data signal connected to its gate terminal. The data line may be a full swing data line so that the information is transferred to the gate. In this manner, a bit by bit partial write becomes possible on the differential data lines: when no write operation is required on a particular data bit (in case of partial write), keeping both write lines at zero ensures that memory data will not be altered. This may enable the implementation of small word sizes—for example, 32 to 128 bit words.

In contrast to the standard macrocell, pure random macrocells may carry out a partial write in one cycle and may therefore be more suited to operations where there is a high frequency of partial writes. Pure random macrocell memory, however, may have high power consumption due to data line buffers leakage and dynamic consumption related to full swing operation.

SUMMARY OF INVENTION

According to a first aspect, there is provided a memory comprising: memory cells; data lines configured to provide data to and from the memory cells, the data lines being grouped into a plurality of blocks, each block comprising a plurality of the data lines; a plurality of block select lines, each block select line being associated with a respective one of the blocks; and selection circuitry for selecting a block in response to a respective block select line, the memory being configured to perform a memory operation using the selected bit line block.

The selection circuitry may be further configured to connect the selected block to selected bit lines. The memory may be configured to carry out the memory operation on memory cells addressed by the selected bit lines. The selection circuitry may be configured to connect the block to the selected bit lines in response to a type of memory operation to be carried out. The selection circuitry is further configured to select the selected bit lines.

The selection circuitry may comprise a plurality of multiplexers corresponding to the data lines. The multiplexers may be configured to connect a respective data line to a bit line. The multiplexers may be configured to select the bit line from a plurality of bit lines. The multiplexers may be configured to connect the respective data line to the bit line in response to a select signal. The select signal may be based on the block select line and at least one of a type of memory operation to be carried out and an indication of a bit line to select.

The memory may further comprise: a plurality of word lines, each word line corresponding to a row of the memory cells, each bit line corresponding to a column of the memory cells. The selection circuitry may be further configured to connect a block to a memory interface in response to the block select line. The selection circuitry may be further configured to connect the block to the memory interface in response to the block select line and a type of memory operation to be carried out.

The memory interface may be configured to receive data to be written to the memory and/or data read from the memory. The memory may further comprise block select generation circuitry for generating a block select signal to a block select line based on a memory instruction. The block select generation circuitry is in a boot strap area of the memory.

According to a second aspect, there may be provided a method comprising: selecting a data line block from a plurality of data line blocks in response to a block select signal associated with the data line block, each data line block comprising a plurality of data lines; and performing a memory operation using the selected block of bit lines.

The method may further comprise connecting the selected block to selected bit lines. The method may further comprise connecting the block to the selected bit lines in response to a type of memory operation to be carried out. The method may further comprise selecting the selected bit lines. The method may further comprise connecting a block to a memory interface in response to the block select line.

The method may further comprise connecting a respective data line to a respective bit line in response to a select signal. The method may further comprise generating the select signal based on the block select line and at least one of a type of memory operation to be carried out and an indication of a bit line to select.

According to a third aspect, there may be provided a memory comprising: memory cells; data lines configured to provide data to and from the memory cells, the data lines being grouped into a plurality of data line blocks and each data line block comprising a plurality of the data lines; a plurality of block select lines, each block select line being associated with a respective one of the data line blocks; and selection means for selecting a data line block in response to a respective block select line, the memory being configured to perform a memory operation using the selected data line block.

According to a fourth aspect, there may be provided an integrated circuit comprising: a memory comprising: memory cells; data lines configured to provide data to and from the memory cells, the data lines being grouped into a plurality of data line blocks, each data line block comprising a plurality of the data lines; a plurality of block select lines, each block select line being associated with a respective one of the data line blocks; and selection circuitry for selecting a data line block in response to a respective block select line, the memory being configured to perform a memory operation using the selected data line block.

DESCRIPTION OF THE DRAWINGS

Embodiments will now be described with reference to the following figures in which.

DETAILED DESCRIPTION

In some embodiments a memory may be provided that implements large word operations while allowing partial operations such as partial writes to take place. In this manner, dynamic and static power related to data transfer in a memory may be reduced. Large word operations may be implemented to maximize bandwidth while operations on smaller words such as at-speed partial writes may also be allowed.

Some embodiments may therefore provide power consumption gains with regards to partial writes. A flexibility of data transfer may also be achieved by providing operation on a full or part of a data bus of a memory.

Figure 1:
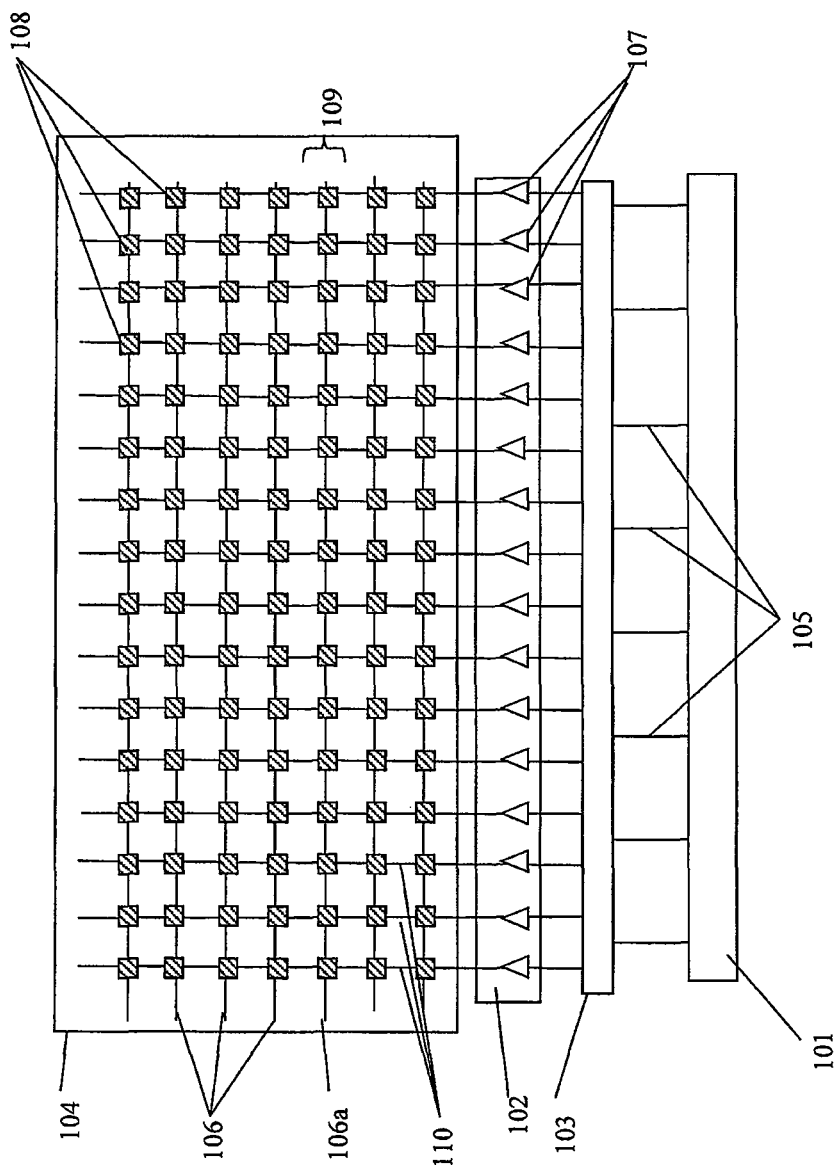
FIG. 1 shows an example of a memory architecture.

Embodiments may have large word memory system capabilities. FIG. 1 shows an architecture of a large word memory system.

A large word may correspond to the size of a memory bus and may comprise in some embodiments more than one 32 bit word.

FIG. 1 comprises a memory interface 101, a switching block 103, a sense amplifier block 102, and a memory module block 104. A plurality of differential data lines 105 may be connected between the memory interface 101 and switching block 103 to receive or transmit data between the memory cells and a memory bus. The memory architecture of FIG. 1 may also comprise a plurality of bit lines 110. The plurality of bit lines 110 may be connected between the switching block 103, sense amplifier block 102 and the memory module block 104.

The sense amplifier block 102 may comprise a plurality of sense amplifiers 107. Each sense amplifier 107 may correspond to one of the bit lines 110. The sense amplifiers 107 may be capable of sensing a charge difference between a bit and compliment bit line of a corresponding differential data line 105. In some embodiments, the sense amplifiers 107 may be capable of providing a charge differential on the bit lines 110.

The switching block 103 may be connected between the sense amplifier block 102 and the memory interface 101. The switching block 103 may be operable to connect the differential data lines 105 to selected bit lines 110. The switching block 103 may be operable to input and output data on the differential data lines 105 from bit lines 110 corresponding to an addressed location in the memory.

It will be appreciated that although each bit line 110 and differential data line 105 is depicted as being a single line, these lines may be differential lines comprising a bit or data line and a compliment bit or data line.

The memory module block 104 may comprise a plurality of word lines 106. Each word line 106 may define a row of memory cells 108 within the memory module block 104. The bit lines 110 may form column lines within the memory module block 104. Memory cells 108 may be located at the intersection of each word line 106 and each bit line 110. The memory cells 108 may be operable to store data and may be responsive to signals on the respective word line 106 and bit line 110.

It will be appreciated that the memory module block 104 is by way of example only and may be implemented in accordance with known memory module architecture and memory cells.

Although sixteen bit lines 110 and five word lines 106 have been depicted in FIG. 1, it will be appreciated that this is for clarification purposes only and a different amount of word lines 106, bit lines 110 and corresponding memory cells 108 may be implemented in accordance with memory architecture and requirements.

Eight differential data lines 105 have been depicted in FIG. 1 with each data line corresponding to two bit lines 110; however, it will be appreciated that this is by way of example only and there may be more or less differential data lines. Additionally differential data lines 105 may correspond to more or less bit lines 110. For example, each data line may correspond to one, two, four or eight bit lines.

The memory interface of FIG. 1 has a memory bus width of eight bits corresponding to 16-bit width memory; however, it will be appreciated that the bus width may be a different amount. The bus width may be, for example, a 64 bit, 128 bit or 256 bit line memory. Additionally, the memory bus may have a different width, for example, corresponding to two, four or eight times the bus width in some embodiments.

The memory architecture of FIG. 1 may be operable to read, write and retain data in the memory cells 108 in response to signals on the word and bit lines. The memory of FIG. 1 may also receive a read or write enable signal in some in embodiments. The memory may also receive a select signal in some embodiments which may indicate which bit line is to be connected to a corresponding differential data line.

To read data from the memory module block 104, in some embodiments the bit lines 110 may be pre-charged to a voltage level between a voltage level required for a logic '1' and a logic '0'. An address decoder (not shown) may drive a word line 106a, corresponding to a row from which data is to be read, high to connect a targeted row of memory cells 108 to the bit lines 110.

When the word line 106a connects the targeted row of memory cells 109 to the bit lines 110, a charge may be transferred between the memory cells and bit lines 110 according to a value stored on the memory cell 108. The sense amplifiers 107 may sense a voltage difference on the differential bit lines 110 and amplify this difference, driving the differential bit lines to reflect the value stored in the memory cell 108. The switching block 103 may connect the differential bit lines 110 to the differential data lines 105, which may output the data via the memory interface 101.

To write data to the memory cells 108, in some embodiments, the switching block 103 may connect the differential data lines 105 holding the data to be written to the addressed differential bit lines 110. The address decoder may drive a word line 106a corresponding to the addressed memory cells 108 high to connect the targeted row 109 to the bit lines 110. The memory cells 108 may then be charged or discharged according to the data on the differential data lines 105 and corresponding bit lines 110 and a write operation is carried out.

The width of the memory interface 101, in other words the number of differential data lines 105, may correspond to a large word and a read or write operation may be carried out for the large memory word. This may be called a large word operation.

In some large word memory architectures, switches of the switching block 103 connecting the bit lines and differential data lines may allow write operations through pass gates. The switching block 103 may receive an enable signal and connect a differential data line to a differential bit line selected by the enable signal. For example a differential data line 105 may be connected to a bit line 110 via a pass transistor. The transistor may receive an enable signal at its gate which may close the transistor to connect a bit line to the differential data line. In, for example, a write operation, a charge from a pre-charged differential data line, corresponding to data to be written, may be transferred to the bit line.

The enable signal in typical large word memory architectures will be asserted for pass gates corresponding to all the differential data lines. The enable signal may be sufficient to switch a pass transistor. For example, for these memories, pre-charged data lines corresponding to the data to be written do not need to switch the pass transistor. This allows the differential data lines 105 to have low swing voltage, which may add to the energy efficiency of the memory.

In some partial write memory systems, such as the pure random macro-cell memory, data is written to memory by providing the data to be written at a gate of a transistor. In some systems a differential data line is input to a gate of the transistor. The remaining two nodes of the transistor may be connected to a bit line and a set voltage, for example ground. The data signal may require sufficient swing to switch the transistor and connect a bit line to the remaining node. For example, a source of a transistor may be grounded and a data signal switching the transistor will connect the bit line to ground. In other words, the memory carries out a full swing data transfer.

Although these partial write memory systems may not draw excessive power for bit-by-bit operation, they may be inefficient for operations requiring many bits to be written. Whereas the large word memory architecture may require a single full swing enable signal, bit-by-bit write memories may require full swing data lines for each bit to be written to.

Embodiments may provide partial operations in addition to large word operations while considering a power efficiency of a memory. In some embodiments, a partial operation, for example, a write operation, to only part of a large word may be carried out. Embodiments may provide both the large word and partial operations while the conserving power of the system.

In embodiments, a large word may correspond to a memory bit-width. The bit-width may be in line with a system bus size. Embodiments may implement large word sizes of, for example, 32, 64, 128 and 256 bits.

Embodiments may include block select lines corresponding to groups or blocks of bits. The block of bits may correspond to a group of differential data lines and/or correspond to a number of bits forming a sub-group of the bit-width of the memory interface 101. The block select lines may break a large memory word into smaller blocks consisting of a number of data lines. In some embodiments, the number of data lines may be 32 bits; however, it will be appreciated that this is by way of example only and the data lines may be grouped into other amounts. In some embodiments, the other amounts may correspond to a number of bits in a system word or a multiple thereof.

The block select lines may enable a write operation on a block of bits. This may be instead of a write operation being carried out on a number of bits corresponding to an entire large word. The block select lines may be used in conjunction with a pass gate signal of the switching block 103 to allow or block a write operation to a selected block of bits. In this manner, write operations to only part of a large word corresponding to a block may take place.

Figure 2:
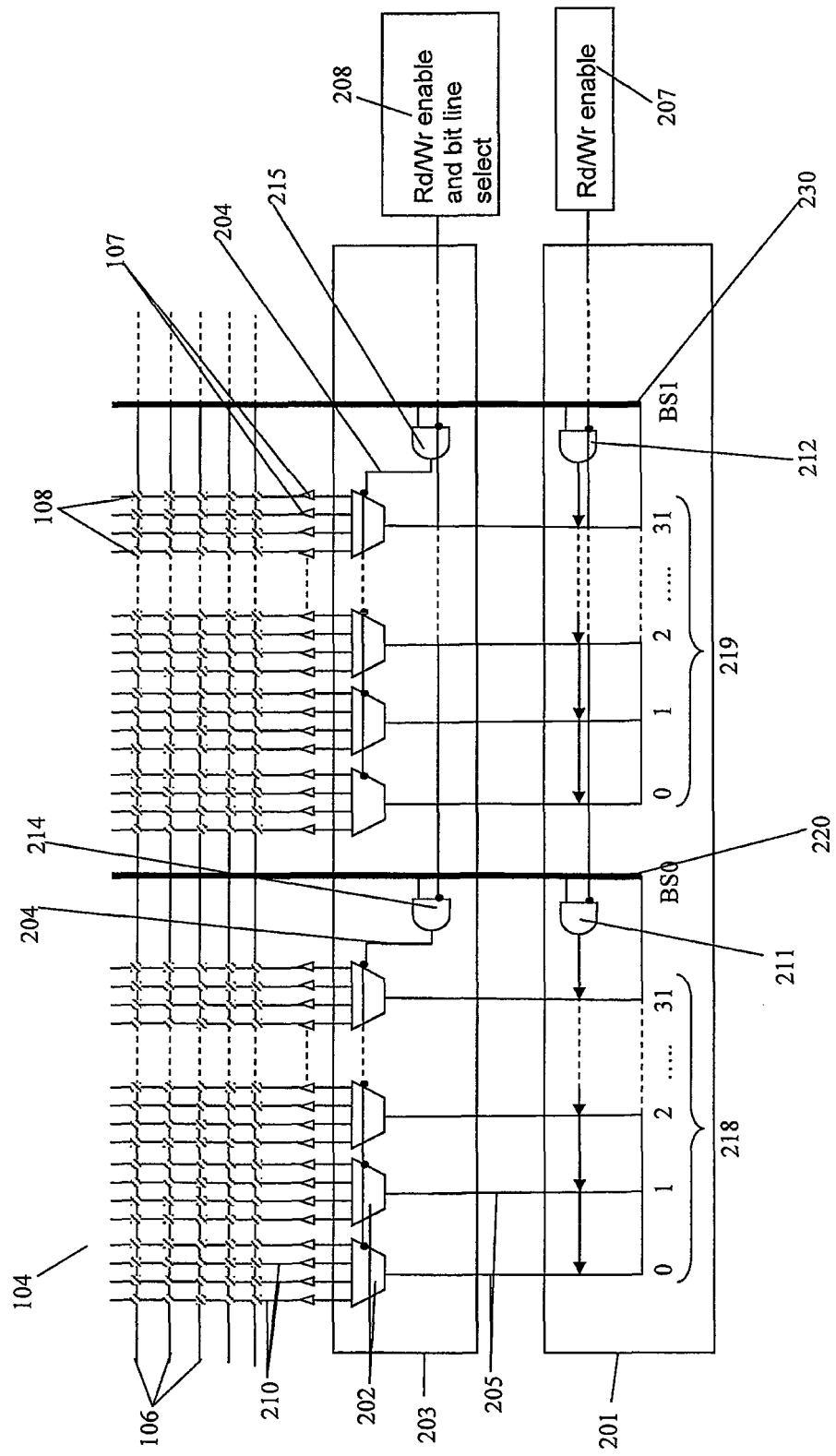
FIG. 2 shows a memory architecture according to an embodiment.

FIG. 2 shows an example of a memory architecture incorporating block select lines.

FIG. 2 comprises a memory interface 201, a switching block 203 and a memory module block 104. A plurality of differential data lines 205 may be connected at the memory interface 201 to receive or transmit memory data. The differential data lines 205 may be connected to the memory interface 201 and the switching block 203. The memory architecture of FIG. 2 may also comprise a plurality of bit lines 210. The bit lines 210 may be connected to the switching block 203 and the memory module block 104.

The memory module block 104 may comprise the plurality of bit lines 210 each having a sense amplifier 107. The memory module block 104 may comprise a plurality of word lines 106. Each word line 106 may define a row of memory cells 108 within the memory module block 104.

It will be appreciated that the architecture of the memory module block 104 with reference to the write lines 106, bit lines 210 and memory cells 108 may be in accordance with those of FIG. 1. It will be appreciated that the memory cells 108 themselves may have any structure suitable for storing data.

In addition to the plurality of bit lines 210 and differential data lines 205, block select lines 220 and 230 may be provided. The block select lines 220 and 230 may be connected to the memory interface 201 and/or the switching block 203. In some embodiments the block select lines 220 and 230 may be connected to block select circuitry (not shown).

The block select circuitry may decode an address for a dynamic operation such as a read or a write and convert the address into signals indicating which block of the large word should be selected for the operation. In some embodiments, the block select circuitry may monitor the instructions received for the memory. Alternatively, the block select circuitry may intercept instructions. In some embodiments the block select circuitry may be implemented in a macrocell's strap area.

Each block select line 220 and 230 may correspond to a number of data lines 205. In this embodiment each block select line 220, 230 corresponds to a group of 32 bits or 32 data lines. The block select lines 220 is shown in conjunction with a first group of bits 218 while the block select line 230 is shown in conjunction with a second group of bits 219.

It will be appreciated that although only two block select lines have been shown for clarity, embodiments may comprise one or more block select lines, each corresponding to a group of bits. It will also be appreciated that although groups of 32 bits have been shown, the block select lines may be associated with the groups of more or less than the number of bits.

In some embodiments, the number of bits in a block is dependent on a word size of the system. The number of bits in the block or group may be determined by a minimum word size that may be required by an application of the memory. In some embodiments, the number of bits in the group may be a fraction of the minimum word size. For example, a memory with a 256 bit large word size and a minimum word size required by an application of 64 bits, may be split into eight blocks of 32 bits each. In this case two blocks may give access to one minimum sized word required by an application of the memory.

As in the memory interface 101 in FIG. 1, the memory interface 201 may be capable of receiving and transmitting data to and from the memory module block 104 and switching block 203. The memory interface 201 may comprise circuitry for selectively coupling differential data lines 205 to enable or block memory operations. Each block select line 220, 230 may be coupled with such circuitry and a signal indicating a type of operation in order to enable or block the operation for the group of bits associated with the block select line.

In this embodiment, the memory interface comprises AND gates 211 and 212. AND gate 211 may receive a first input from block select lines 220 and a second input from a read/write enable block 207. An output of AND gate 211 is connected to the group of differential data lines 205 associated with the block select line 220. The AND gate 212 may receive a first input from the block select line 230 and a second input from the read/write enable block 207. An output of the AND gate 212 is connected to the group of differential data lines 205 associated with the block select lines 230. It will be appreciated that further AND gates connected to further block select lines may be implemented in accordance with embodiments.

The switching block 203 may comprise switches 202. In some embodiments the switches 202 may be multiplexers. In the embodiments of FIG. 2, each switch 202 corresponds to a data line 205. A switch 202 may be connected to a number of bit lines. In the embodiments of FIG. 2, each switch 202 is connected to four bit lines 210; however, it will be appreciated that each switch may be connected to more or less bit lines. In some embodiments, each switch 202 may be connected to one bit line 210.

In some embodiments, the switches may connect a data line 205 to a selected one of the bit lines 210 connected to it. In this manner, a switch may act as a multiplexor. Each switch may receive a select signal 204 and connect a data line 205 to a bit line 210 based on this signal.

The switching block 203 may further comprise circuitry for selectively coupling the bit lines 210 to the differential data lines 205 in order to enable or block memory operations. In some embodiments the bit lines 210 of a block 218 and 219 may be selectively coupled to the differential data lines 205 of that block 218 and 219. Each block select line 220 and 230 may be coupled with such selection circuitry and a signal indicating a type of operation and bit line selection in order to enable or block the operation for the group of bits 218 and 219 associated with the block select line 220 and 230.

In the embodiments, a select signal 204 is provided to the switches 202. The select signal 204 may be provided by an AND gate 214 for the first group of bits 218 and by an AND gate 215 for the second group of bits 219. Each AND gate 214, 215 may receive an input from the corresponding block select lines 220 and 230 and a read write enable and bit line select signal from a Rd/Wr enable block 207 and bit select block 208.

The read write enable and bit line select signal may provide an indication of the type of operation carried out as well as an indication of which bit line 210 a switch 202 is to connect a corresponding data line 205 to.

In this embodiment, AND gates 214 and 215 are provided for selectively coupling the switches 202. The AND gates 211 and 212 in some embodiments may deselect a group of bits 218 and 219 by blocking the read write enable and bit line select signal.

It will be appreciated that read write enable block 207 and bit line select block 208 and the read/write enable block 207 may be the same block in some embodiments and may be implemented in the same circuitry.

The functioning of the memory architecture of FIG. 2 will now be discussed in relation to FIG. 3.

Figure 3:
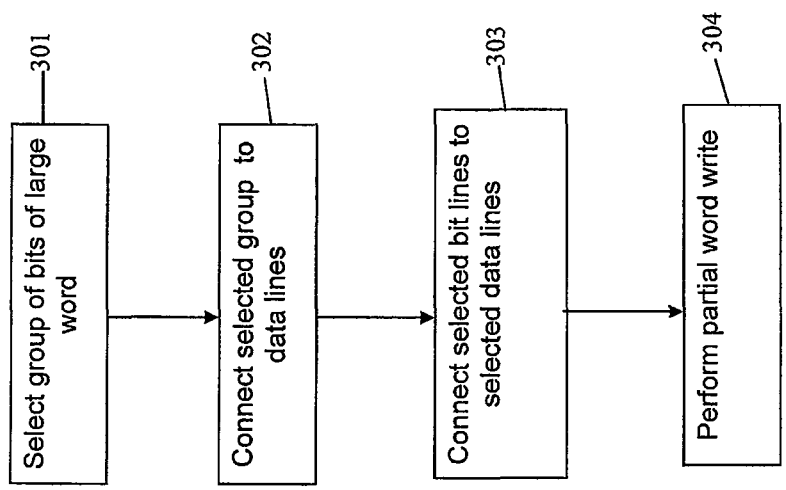
FIG. 3 shows a method in accordance with an embodiment.

FIG. 3 shows a flow diagram of an example operation of the architecture of FIG. 2.

When a partial write instruction is received, it is determined which group of bits 218 and 219 is to be written to. In some embodiments, this determination is carried out by block select circuitry.

At step 301, a group of bits to be written to corresponding to a group of data lines may be selected. This selection may be carried out by the selection circuitry 211 and 212.

At step 302, the selected group of data lines may be connected to input data at the memory interface. The data to be written may be input on data input pins of the memory interface 201 and data lines corresponding to the block of bits to be written to may be connected to the corresponding data inputs to the memory interface.

In the embodiments, the read/write enable block 207 may output a signal indicating that a write operation is to occur. A block select line corresponding to the group of differential data lines to be written to will indicate that that group of bits is selected. For example, the block select line may go high. Alternatively, the group of bits may be selected by pulling the block select line low. The selection circuitry corresponding to a group of bits may only select the group of bits if a write indication and a block select line indication is received. In some embodiments, the selected group of differential data lines may be coupled to switching block 203 and may provide data to be written to the switching block 203.

The differential data lines 205 may provide an indication of the value to be written to the memory. Once the data input from the memory interface has been received, the Rd/Wr enable block 207 may de-assert a signal in some embodiments to disconnect the I/O interface from the input data lines. In these embodiments, changes on the input data lines may not affect writing of the data.

It will be appreciated that the block select lines 220 and 230 may select whether or not a signal from the Rd/Wr enable block 207 may be passed to connect the block of differential data lines. For example, in one embodiment the blocks of differential data lines may be disconnected from the I/O interface by default and an assertion of both the block select line for that block and Rd/Wr enable signal is required to connect the differential data line to the pins of the I/O interface.

Alternatively, in another embodiment, the blocks of differential data lines may be connected to the I/O interface by default and an assertion of both the block select line for that block and Rd/Wr enable signal will disconnected the differential data lines and the pins of the I/O interface.

In the embodiment of FIG. 2, for example, the read/write enable block 207 may provide a high signal to the AND gate 211 and 212 indicating a write operation is to take place. If the first group of bits 218 is to be written to, then block select line 220 may go high and AND gate 211 will output a high signal coupling the first group of bits 218 to data input on I/O interface. Block select line 230 may remain low and AND gate 212 will output a low signal indicating that a write operation is not to be carried out on the second group of bits 219.

At step 303, switches 202 corresponding to the group of bits to be written to are closed to connect the selected differential data lines to selected bit lines to perform the write operation. Selection circuitry in the switching block 203 may, for example, receive an indication that a write is to take place and an indication of which group of bits 218, 219 are to be written to.

In other words, a read write enable and bit line select signal may be output by the Rd/Wr enable block 207 and bit select block 208 indicating that a write operation is to take place and to which bit lines each switch should connect. The selection circuitry 214 and 215 receive indications from the corresponding block select line whether or not that block is selected. If the block is selected, the selection circuitry may pass through the read write enable and bit select line signal and the switches may switch accordingly. If the block is not selected, the selection circuitry may block the read write enable and bit select line signal.

In the example of FIG. 2, the read/write enable and bit line select block 208 may output a signal indicating that a write operation is to take place. The selection circuitry of AND gates 214 and 215 may receive this signal in addition to a respective block select signal. If the first group of bits is to be written to, block select line 220 may go high and AND gate 214 will output a high signal coupling respective switches 202 to the indicated bit lines 210. Block select line 230 may remain low and AND gate 215 will output a low signal indicating that a write operation is not to be carried out on the second group 219. In this case, the second group 219 will not be coupled to bit lines 110.

A partial word write may be carried out at step 304. In this manner, a partial word write is performed on only the selected block of bits of a large memory word.

It will be appreciated that the high or low signal is by way of example only and may alternatively be a different indication.

In some embodiments, more than one group of bits 218, 219 may be written to. This may be done by activating the relative block select lines. For example, if both block select line 220 and block select line 230 are activated, the first and second group of bits 218 and 219 will be selected.

In this manner, embodiments of the present invention may allow a large word memory architecture for increased bandwidth whilst still allowing a high frequency of partial writes.

It will be appreciated that although the foregoing has exemplified a write operation, a partial read operation may alternatively or in addition to take place. In the embodiments, the selection circuitry may receive a read enable signal instead of a write enable signal. The read enable signal may be generated by blocks 207 and 208 or may be generated by different read specific circuitry. The differential data lines 205 may be connected to selected bit lines 210 by the selection circuitry 214 and 215 and connected to the memory interface data outputs by the selection circuitry 211 and 212. It will be appreciated that in this manner a partial read operation may take place. A block 218 and 219 for a read operation may be selected similarly to that of a partial write operation.

Some embodiments may also be implemented in conjunction with other memory performance enhancement means. For example, some embodiments may be implemented with redundancy and/or error code correction management.

Error code correction management and redundancy data may be included in some memory systems in order to provide error checking and/or correction to data read from or written to the memory. Some embodiments may incorporate bit lines within a bit block or group in order to provide error code correction management and/or redundancy.

Figure 4C:
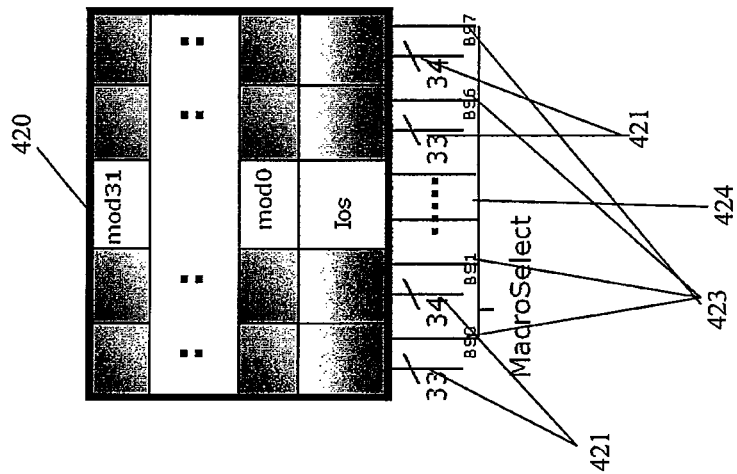
FIGS. 4a, 4b and 4c show a memory architecture in accordance with some embodiments.
Figure 4B:
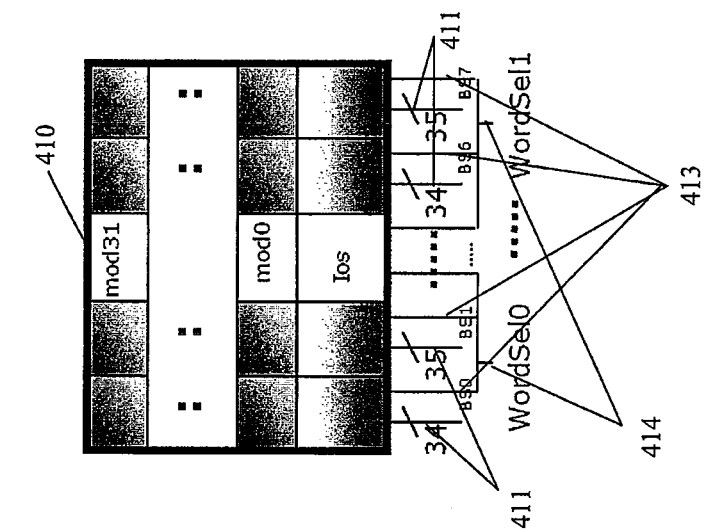
Figure 4A:
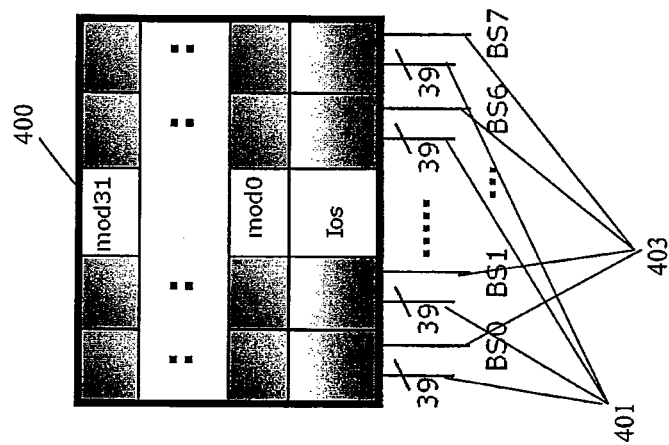

FIGS. 4a, 4b and 4c show some embodiments incorporating error correction management and/or redundancy.

FIG. 4a shows an example of a macrocell memory 400. The macrocell memory 400 comprises 8 words of 32 bits each. In addition the macrocell memory 400 includes a seven bit error correcting code. In this embodiment, each block or group of bits of the macrocell memory 400 consists of 39 bits (32 bits of the word and the seven bit error correcting code). The embodiment of FIG. 4a does not include redundancy bits.

In addition to these 39 bit blocks 401, the macrocell memory of FIG. 4a may include block select lines 403 corresponding to each bit block 401. The block select lines 403 may be operable to select a group of bits 401 to be written to.

FIG. 4b shows a second example of a macrocell memory 410. The macrocell memory 410 comprises two words of 128 bits each. In addition, the macrocell memory 410 includes a nine bit error correcting code and one redundancy bit. In this embodiment, each block or group of bits 411 of the macrocell memory 410 consists of alternating 34 or 35 bits respectively (128 bits of the word, the nine bit error correcting code and the redundancy bit averaging 34.5 bits per block).

In addition to these 34/35 group of bits 411, the macrocell memory may include block select lines 413 corresponding to each bit group 411. The block select lines 413 may be operable to select a group of bits 411 to be written to. Groups of block select lines 413 are further joined together to form word select groups addressed by word select lines 414. The bits may be selectable in blocks by the block select lines 313 or word groups by the word select line 414.

FIG. 4c shows a third example of a macrocell memory 420. The macrocell memory 420 comprises one word of 256 bits. In addition, the macrocell memory 420 includes a 10 bit error correcting code and two redundancy bits. In this embodiment, each block or group of bits 421 of the macrocell memory 420 consists of alternating 33 or 34 bits respectively (256 bits of the word, the 10 bit error correcting code and the redundancy bits averaging 33.5 bits per block).

In addition to these 33/34 bit blocks 421, the macrocell memory 420 may include block select lines 423 corresponding to each bit group 421. The block select lines 423 may be operable to select a group of bits 421 to be written to. Groups of block select lines 423 are further joined together to a word select group addressed by word select line or macro select line 424. The bits may be selectable in blocks by the block select lines 423 or word groups by the word select line 424.

It will be appreciated that the macrocell memories 400, 410 and 420 may include circuitry and may operate in accordance with the embodiments of FIGS. 1 to 3.

In accordance with the embodiments of FIGS. 4a through c, each macrocell comprises eight sub-blocks. In the embodiments, the number of bits in a sub-block is 32 bits plus any redundancy or error correction code bits that may be implemented.

In some embodiments, in the implementation of error code correction management and redundancy, the number of bits in a bit block 401, 411 and 421 may be adjusted to take into account error code correction management and redundancy bits. For example, in FIG. 4a, the block size has been changed from 32 bits to 39, in FIG. 4b the block size has been increased to 34 or 35 bits from 32 bits, and in FIG. 4c the block size is increased to 33 or 34 bits. In some embodiments this may require only a minor redesign to change the data format.

By implementing block select lines grouping numbers of bits, some embodiments may provide only one full swing data transfer line corresponding to the block select signal per the number of data lines in a group. The data lines in the group may be low swing data lines. This may limit the amount of dynamic power consumed. Static power may also be reduced by the reduction of data line drivers. In some embodiments, this may be due to the selection of data lines to be connected to the memory bit lines. A single architecture may be implemented for a variety of customer needs. Needs for a high or low frequency of partial writes may be addressed by some embodiments.

In the embodiments, the performance of a standard memory macrocell may not be compromised. The write cycle time of embodiments may be equivalent to the time taken for a refresh cycle time and embodiments may negate the need for a read/modify/write operation to be carried out to perform a partial write.

Although the foregoing description has exemplified a write operation, it will be appreciated that a partial read operation may also take place. Embodiments may be used to limit power consumed in a read operation. For example, sense amplifiers may be selectively connected to a group of data lines corresponding to the memory cells to be read. In these embodiments, only the data on selected bit lines may be transferred to global read lines.

Throughout the foregoing, reference has been made to a pass gate or writing through a pass gate. It will be appreciated that in some embodiments this may refer to providing a signal at a gate of a transistor to transfer a signal at one node of the transistor to another node of the transistor. For example, for an NMOS transistor, a signal at the transistor source may be transferred to the transistor drain and for a PMOS transistor, a signal at the transistor drain may be transferred to a transistor source. A pass gate signal may be a signal applied at a gate of such a transistor.

The invention claimed is:

1. A memory comprising:
   memory cells;
   data lines configured to provide data to and from the memory cells, the data lines being grouped into a plurality of blocks, each block comprising a plurality of the data lines;
   a plurality of block select lines, each block select line being associated with a respective one of the blocks; and
   selection circuitry for selecting the block in response to a respective block select line, the memory being configured to perform a memory operation using a selected bit line block,
   wherein the selection circuitry is configured to connect the selected bit line block to selected bit lines in response to a type of memory operation to be carried out.

2. The memory of claim 1, wherein the memory is configured to carry out the memory operation on the memory cells addressed by the selected bit lines.

3. The memory of claim 1, wherein the selection circuitry is further configured to select the selected bit lines.

4. The memory of claim 1, wherein the selection circuitry comprising a plurality of multiplexers corresponding to the data lines.

5. The memory of claim 4, wherein the multiplexers are configured to connect a respective data line to a bit line.

6. The memory of claim 5, wherein each multiplexor is configured to select the bit line from a plurality of bit lines.

7. The memory of claim 5, wherein the multiplexers are configured to connect the respective data line to the bit line in response to a select signal.

8. The memory of claim 7, wherein the select signal is based on the block select line and at least one of the type of memory operation to be carried out and an indication of the bit line to select.

9. The memory of claim 1 further comprising:
   a plurality of word lines, each word line corresponding to a row of the memory cells, each bit line corresponding to a column of the memory cells.

10. The memory of claim 1, wherein the selection circuitry is further configured to connect the block to a memory interface in response to the block select line.

11. The memory of claim 10, wherein the selection circuitry is further configured to connect the block to the memory interface in response to the block select line and a type of memory operation to be carried out.

12. The memory of claim 10, wherein the memory interface is configured to receive the data to be written to the memory and/or the data read from the memory.

13. The memory of claim 1 further comprising block select generation circuitry for generating a block select signal to the block select line based on a memory instruction.

14. The memory of claim 13, wherein the block select generation circuitry is in a boot strap area of the memory.

15. A method comprising:
   selecting a data line block from a plurality of data line blocks in response to a block select signal associated with the data line block, each data line block comprising a plurality of data lines; and
   performing a memory operation using a selected block of bit lines; and
   connecting the selected block of bit lines to selected bit lines in response to a type of memory operation to be carried out.

16. The method of claim 15 further comprising selecting the selected bit lines.

17. The method of claim 15 further comprising connecting a block to a memory interface in response to a block select line.

18. The method of claim 15 further comprising connecting a respective data line to a respective bit line in response to a select signal.

19. The method of claim 18 further comprising generating the select signal based on a block select line and at least one of a type of memory operation to be carried out and an indication of a bit line to select.

20. A memory comprising:
   memory cells;
   data lines configured to provide data to and from the memory cells, the data lines being grouped into a plurality of blocks, each block comprising a plurality of the data lines;
   a plurality of block select lines, each block select line being associated with a respective one of the blocks; and
   selection circuitry for selecting the block in response to a respective block select line, the memory being configured to perform a memory operation using a selected bit line block,
   wherein the selection circuitry is further configured to connect the block to the memory interface in response to the block select line and a type of memory operation to be carried out.

21. A memory comprising:

memory cells;

data lines configured to provide data to and from the memory cells, the data lines being grouped into a plurality of blocks, each block comprising a plurality of the data lines;

a plurality of block select lines, each block select line being associated with a respective one of the blocks;

selection circuitry for selecting the block in response to a respective block select line, the memory being configured to perform a memory operation using a selected bit line block; and block select generation circuitry in a boot strap area of the memory for generating a block select signal to the block select line based on a memory instruction.

* * * * *

UNITED STATES PATENT AND TRADEMARK OFFICE
CERTIFICATE OF CORRECTION

PATENT NO. : 8,526,264 B2
APPLICATION NO. : 13/172592
DATED : September 3, 2013
INVENTOR(S) : Anuj Parashar and Marc Vernet Page 1 of 1

It is certified that error appears in the above-identified patent and that said Letters Patent is hereby corrected as shown below:

Title Page,

Item (73) Assignee: "STMicroelectronics International N.V., Amsterdam (NL)"

should be

--STMicroelectronics International N.V., Amsterdam (NL);

STMicroelectronics (Crolles 2) SAS, Crolles, France--

Signed and Sealed this
Twenty-sixth Day of August, 2014

Michelle K. Lee
*Deputy Director of the United States Patent and Trademark Office*